United States Patent
Lee et al.

(10) Patent No.: US 11,967,962 B2
(45) Date of Patent: Apr. 23, 2024

(54) OSCILLATION SYSTEM INCLUDING FREQUENCY-LOCKED LOOP LOGIC CIRCUIT AND OPERATING METHOD THEREOF

(71) Applicant: SAMSUNG ELECTRONICS CO., LTD., Suwon-si (KR)

(72) Inventors: Jusung Lee, Seoul (KR); Wooseok Kim, Suwon-si (KR); Wonsik Yu, Anyang-si (KR); Chanyoung Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 17/860,519

(22) Filed: Jul. 8, 2022

(65) Prior Publication Data

US 2023/0009620 A1 Jan. 12, 2023

(30) Foreign Application Priority Data

Jul. 8, 2021 (KR) .......................... 10-2021-0089935

(51) Int. Cl.
*H03L 7/099* (2006.01)
*H03L 7/07* (2006.01)
*H03L 7/091* (2006.01)
*H03L 7/18* (2006.01)

(52) U.S. Cl.
CPC .............. *H03L 7/0991* (2013.01); *H03L 7/07* (2013.01); *H03L 7/091* (2013.01); *H03L 7/18* (2013.01)

(58) Field of Classification Search
CPC . H03L 7/07; H03L 7/071; H03L 7/085; H03L 7/099; H03L 7/0991; H03L 7/0992; H03L 7/10; H03L 7/104; H03L 7/16; H03L 7/18; H03L 7/183
USPC .... 375/327, 376; 327/5, 105, 144, 151, 156, 327/160; 331/143, 150, 153
See application file for complete search history.

(56) References Cited

U.S. PATENT DOCUMENTS

| | | | |
|---|---|---|---|
| 4,580,165 A | * | 4/1986 | Patton ...................... H04N 5/12 348/505 |
| 5,663,675 A | | 9/1997 | O'Shaughnessy |
| 7,579,919 B1 | | 8/2009 | Cao |
| 9,685,964 B1 | | 6/2017 | Kaczynski |
| 10,250,226 B2 | | 4/2019 | Saji |
| 10,566,980 B2 | | 2/2020 | Gupta et al. |

(Continued)

FOREIGN PATENT DOCUMENTS

KR 100642915 B1 11/2006

*Primary Examiner* — Young T. Tse
(74) *Attorney, Agent, or Firm* — Sughrue Mion, PLLC

(57) ABSTRACT

A frequency-locked loop (FLL) logic circuit, including a validity signal generator configured to receive an external clock signal and determine whether a glitch occurs in the external clock signal; a clock divider configured to generate a reference frequency clock signal based on the external clock signal and a determination result of the validity signal generator; a synchronizer configured to synchronize a phase of an oscillator clock signal with a phase of the reference frequency clock signal; a clock counter configured to count a number of pulses of the oscillator clock signal during a reference time; and a code limiter configured to determine a range of a frequency selection value for calibrating an operating frequency of the oscillator clock signal based on the counted number of pulses.

20 Claims, 7 Drawing Sheets

(56) References Cited

U.S. PATENT DOCUMENTS

| | | |
|---|---|---|
| 10,615,808 B1 | 4/2020 | Wang et al. |
| 10,862,487 B2 | 12/2020 | Kumar et al. |
| 2008/0232179 A1* | 9/2008 | Kwak ..................... G11C 7/22 |
| | | 327/158 |
| 2015/0185263 A1 | 7/2015 | Clapp et al. |
| 2016/0241248 A1 | 8/2016 | Elkholy et al. |
| 2022/0021392 A1* | 1/2022 | Kim ....................... H03L 7/087 |

* cited by examiner

FIG. 6

| TEMPERATURE | INT_FSEL |
|---|---|
| −25℃ | 80 |
| 0℃ | 90 |
| 25℃ | 100 |
| 50℃ | 105 |
| 75℃ | 110 |
| 100℃ | 120 |

OSCILLATION SYSTEM INCLUDING FREQUENCY-LOCKED LOOP LOGIC CIRCUIT AND OPERATING METHOD THEREOF

CROSS-REFERENCE TO RELATED APPLICATION

This application is based on and claims priority under 35 U.S.C. § 119 to Korean Patent Application No. 10-2021-0089935, filed on Jul. 8, 2021, in the Korean Intellectual Property Office, the disclosure of which is incorporated by reference herein in its entirety.

BACKGROUND

1. Field

The disclosure relates to an oscillation system, and more particularly, to an oscillation system including a frequency-locked loop and an operating method thereof.

2. Description of Related Art

In integrated circuits, an oscillation signal may be variously used. For example, the operation of an integrated circuit processing a digital signal may be synchronized with an oscillation signal (or a clock signal). An oscillation signal may also be used to process an analog signal such as a radio frequency (RF) band signal. When not a phase-locked loop (PLL) but a relaxation oscillator is used as a clock source in many systems, there are advantages such as cost saving and reduction in power consumption. However, a relaxation oscillator is vulnerable to temperature change. The resistance of a resistor that is a passive element fundamentally increases or decreases in proportion to the temperature, thereby changing a frequency. This may inevitably cause a fatal problem in a system.

SUMMARY

Provided are an oscillation system for performing frequency calibration based on a non-continuous source.

Additional aspects will be set forth in part in the description which follows and, in part, will be apparent from the description, or may be learned by practice of the presented embodiments.

In accordance with an aspect of the disclosure, a frequency-locked loop (FLL) logic circuit includes a validity signal generator configured to receive an external clock signal and determine whether a glitch occurs in the external clock signal; a clock divider configured to generate a reference frequency clock signal based on the external clock signal and a determination result of the validity signal generator; a synchronizer configured to synchronize a phase of an oscillator clock signal with a phase of the reference frequency clock signal; a clock counter configured to count a number of pulses of the oscillator clock signal during a reference time; and a code limiter configured to determine a range of a frequency selection value for calibrating an operating frequency of the oscillator clock signal based on the counted number of pulses.

In accordance with an aspect of the disclosure, an oscillation system includes a relaxation oscillator including a resistive element and a capacitor; and a frequency-locked loop (FLL) logic circuit including: a validity signal generator configured to receive an external clock signal and determine whether there is a glitch in the external clock signal, a clock divider configured to generate a reference frequency clock signal based on the external clock signal and a determination result of the validity signal generator, a synchronizer configured to synchronize a phase of an oscillator clock signal with a phase of the reference frequency clock signal, a clock counter configured to count a number of pulses of the oscillator clock signal for a reference time, and a code limiter configured to determine a range of a frequency selection value for calibrating an operating frequency of the oscillator clock signal based on the counted number of pulses.

In accordance with an aspect of the disclosure, an operating method of a frequency-locked loop (FLL) logic circuit includes receiving an external clock signal; determining whether a glitch occurs in the external clock signal; generating a reference frequency clock signal based on determining that the glitch does not occur in the external clock signal; synchronizing a phase of the reference frequency clock signal with a phase of an oscillator clock signal; performing clock counting; determining whether an operating frequency of the oscillator clock signal is identical to a target frequency based on a result of the clock counting; and adjusting a frequency selection value based on the result of the clock counting, wherein the frequency selection value is used to calibrate the operating frequency of the oscillator clock signal.

In accordance with an aspect of the disclosure, an oscillation system includes a relaxation oscillator configured to provide an oscillation clock signal; and a frequency-locked loop (FLL) logic circuit configured to: receive an external clock signal; during a first time period in which the external clock signal is determined to be valid: based on determining that an oscillation frequency of the oscillation clock signal does not match a target frequency, adjust a frequency selection signal based on the external clock signal and a difference between the oscillation frequency and the target frequency, and provide the frequency selection signal to the relaxation oscillator, wherein the frequency selection signal causes the relaxation oscillator to adjust the oscillation frequency to match the target frequency; and during a second time period in which the external clock signal is determined to be not valid, maintain the frequency selection signal at a constant value.

BRIEF DESCRIPTION OF THE DRAWINGS

The above and other aspects, features, and advantages of certain embodiments of the present disclosure will be more apparent from the following description taken in conjunction with the accompanying drawings in which:

FIG. 6 is a mapping table between temperature and an internal frequency selection signal, according to an embodiment.

DETAILED DESCRIPTION OF EMBODIMENTS

Figure 1:
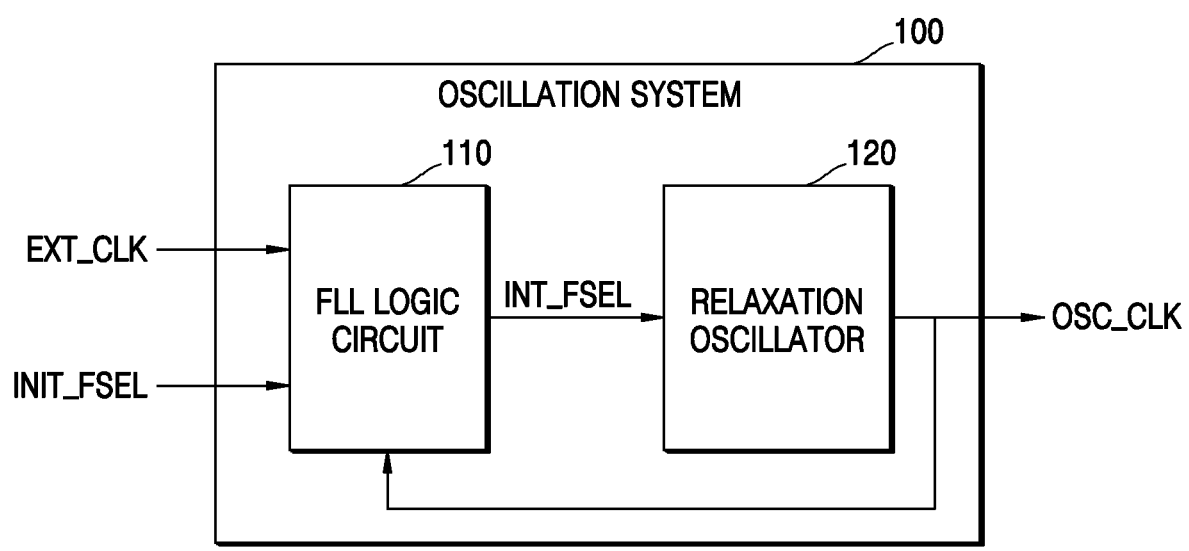
FIG. 1 is a block diagram of an oscillation system according to an embodiment.

Hereinafter, embodiments are described in detail with reference to the accompanying drawings. All of the embodiments described herein are example embodiments.

As is traditional in the field, embodiments may be described and illustrated in terms of blocks which carry out a described function or functions. These blocks, as shown in the drawings, which may be referred to herein as units or modules or the like, or by names such as circuit, generator, divider, synchronizer, counter, limiter, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

FIG. 1 is a block diagram of an oscillation system according to an embodiment.

Referring to FIG. 1, an oscillation system 100 may include a frequency-locked loop (FLL) logic circuit 110 and a relaxation oscillator 120. According to an embodiment, the oscillation system 100 may be implemented on a wafer of an integrated circuit (IC) including analog elements.

According to an embodiment, the FLL logic circuit 110 may perform frequency calibration such that an oscillator frequency is locked to a target frequency. The target frequency may be a frequency that is used for the internal operation of an electronic device including the oscillation system 100.

According to an embodiment, the FLL logic circuit 110 may receive an external clock signal EXT_CLK and an initial frequency selection signal INIT_FSEL and output a internal frequency selection signal INT_FSEL to the relaxation oscillator 120. The external clock signal EXT_CLK may correspond to a reference frequency of the relaxation oscillator 120.

The initial frequency selection signal INIT_FSEL may refer to an initial setting value for outputting the target frequency based on the external clock signal EXT_CLK. The frequency of an oscillator clock signal OSC_CLK may be different according to a process condition of the oscillation system 100 even if the external clock signal EXT_CLK is the same. For example, a chip including a first oscillation system may be created in the central region of a wafer, and a chip including a second oscillation system may be created in a boundary region of the wafer. In this case, the chip including the first oscillation system may output the target frequency as the frequency of the oscillator clock signal OSC_CLK when the value of the internal frequency selection signal INT_FSEL is 100 with respect to the external clock signal EXT_CLK, and the chip including the second oscillation system may output the oscillator frequency OSC_CLK, which has the same frequency as the target frequency, when the value of the internal frequency selection signal INT_FSEL is 120. In other words, the value of the initial frequency selection signal INIT_FSEL is the initial value of the internal frequency selection signal INT_FSEL, which may be used by the oscillation system 100 to output the target frequency based on the external clock signal EXT_CLK.

According to an embodiment, the external clock signal EXT_CLK may not be input, or may not always be input, to the FLL logic circuit 110. The external clock signal EXT_CLK may correspond to a non-continuous clock signal or an intermittent clock signal. For example, other modules (e.g., a memory and a central processing unit (CPU)) receiving the oscillator clock signal OSC_CLK may not operate for a certain time period or may enter an idle mode in response to a user input. In this case, when the other modules enter the idle mode, the oscillation system 100 may determine not to provide the oscillator clock signal OSC_CLK to the other modules to reduce power consumption. According to the related art, an FLL logic circuit may receive a continuous clock signal and perform frequency calibration, but may not perform frequency calibration with respect to a non-continuous or an intermittent clock signal.

According to an embodiment, the relaxation oscillator 120 may be a module configured to output the oscillator clock signal OSC_CLK. The oscillator clock signal OSC_CLK may be transmitted to other modules requiring a clock signal.

Figure 2:
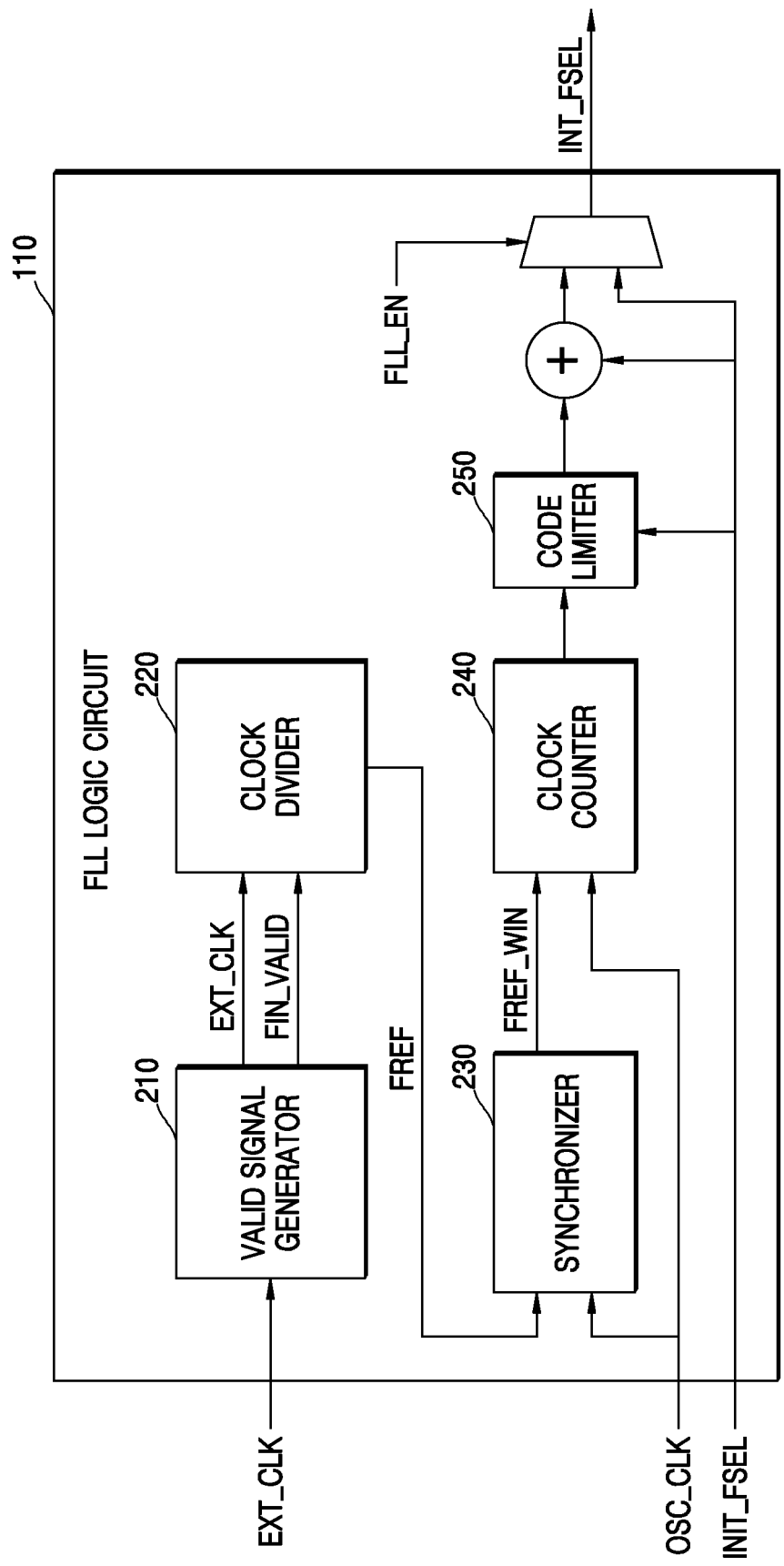
FIG. 2 is a block diagram of a frequency-locked loop (FLL) logic circuit according to an embodiment.

FIG. 2 is a block diagram of the FLL logic circuit 110 according to an embodiment.

Referring to FIG. 2, the FLL logic circuit 110 may include a validity signal generator 210, a clock divider 220, a synchronizer 230, a clock counter 240, and a code limiter 250.

The validity signal generator 210 may receive the external clock signal EXT_CLK and determine the validity of the external clock signal EXT_CLK. For example, the validity signal generator 210 may determine a validity signal based on whether there is a glitch in the external clock signal EXT_CLK. The validity signal generator 210 may determine that there is a glitch in the external clock signal EXT_CLK when the magnitude of the external clock signal EXT_CLK exceeds a certain value. When there is a glitch in the external clock signal EXT_CLK, the validity signal generator 210 may not output a validity signal FIN_VALID to the clock divider 220. When the magnitude of the external clock signal EXT_CLK does not exceed a certain value, the validity signal generator 210 may generate and transmit the validity signal FIN_VALID to the clock divider 220.

The clock divider 220 may receive the external clock signal EXT_CLK and the validity signal FIN_VALID and output a reference frequency signal FREF based on the external clock signal EXT_CLK and the validity signal FIN_VALID. That is, the clock divider 220 may generate and transmit a clock signal having a target frequency to the synchronizer 230 based on to the validity signal FIN_VALID received from the validity signal generator 210. For example, when the validity signal FIN_VALID is logic high, the clock divider 220 may output the reference frequency signal FREF by dividing the frequency of the external clock signal EXT_CLK. When the validity signal FIN_VALID is logic low, the clock divider 220 may bypass the generation of the reference frequency signal FREF because there is a glitch in the external clock signal EXT_CLK. According to an embodiment, the clock divider 220 may receive the external clock signal EXT_CLK and output the reference frequency signal FREF by dividing the frequency of the external clock signal EXT_CLK by 500. For example, the frequency of the external clock signal EXT_CLK may be 100 MHz, and the frequency of the reference frequency signal FREF output by the clock divider 220 may be 200 KHz.

The synchronizer 230 may receive the oscillator clock signal OSC_CLK from the relaxation oscillator 120 and the reference frequency signal FREF from the clock divider 220. The synchronizer 230 may include a D flip-flop and synchronize the phase of the reference frequency signal FREF with the phase of the oscillator clock signal OSC_CLK based on the D flip-flop.

The clock counter 240 may be a module configured to count the number of pulses of an input clock signal. The clock counter 240 may receive the oscillator clock signal OSC_CLK from the relaxation oscillator 120. The clock counter 240 may be configured to count pulses of the oscillator clock signal OSC_CLK for a reference time. The reference time may be determined based on the magnitude of a reference frequency window FREF_WIN. The reference time may vary with the performance or the like of a module such as an oscillator. For example, the reference time may be 1 millisecond (ms) but is not limited thereto. The clock counter 240 may be configured to input a count value to the code limiter 250. The code limiter 250 may determine a variance in an internal frequency selection signal INT_FSEL (as shown for example in FIG. 3) based on the count value. For example, when a code limit enable signal CODE_LIMIT_EN (as shown for example in FIG. 3) is activated, the code limiter 250 may output a variance in the internal frequency selection signal INT_FSEL within a range between an upper bound and a lower bound based on the initial frequency selection signal INIT_FSEL. In some embodiments, an output of the code limiter 250 may be added to the initial frequency selection signal INIT_FSEL using an adder. The output of the adder may be provided, along with the initial frequency selection signal INIT_FSEL, to a multiplexer which may output the internal frequency selection signal INT_FSEL based on an FLL enable signal FLL_EN.

Figure 3:
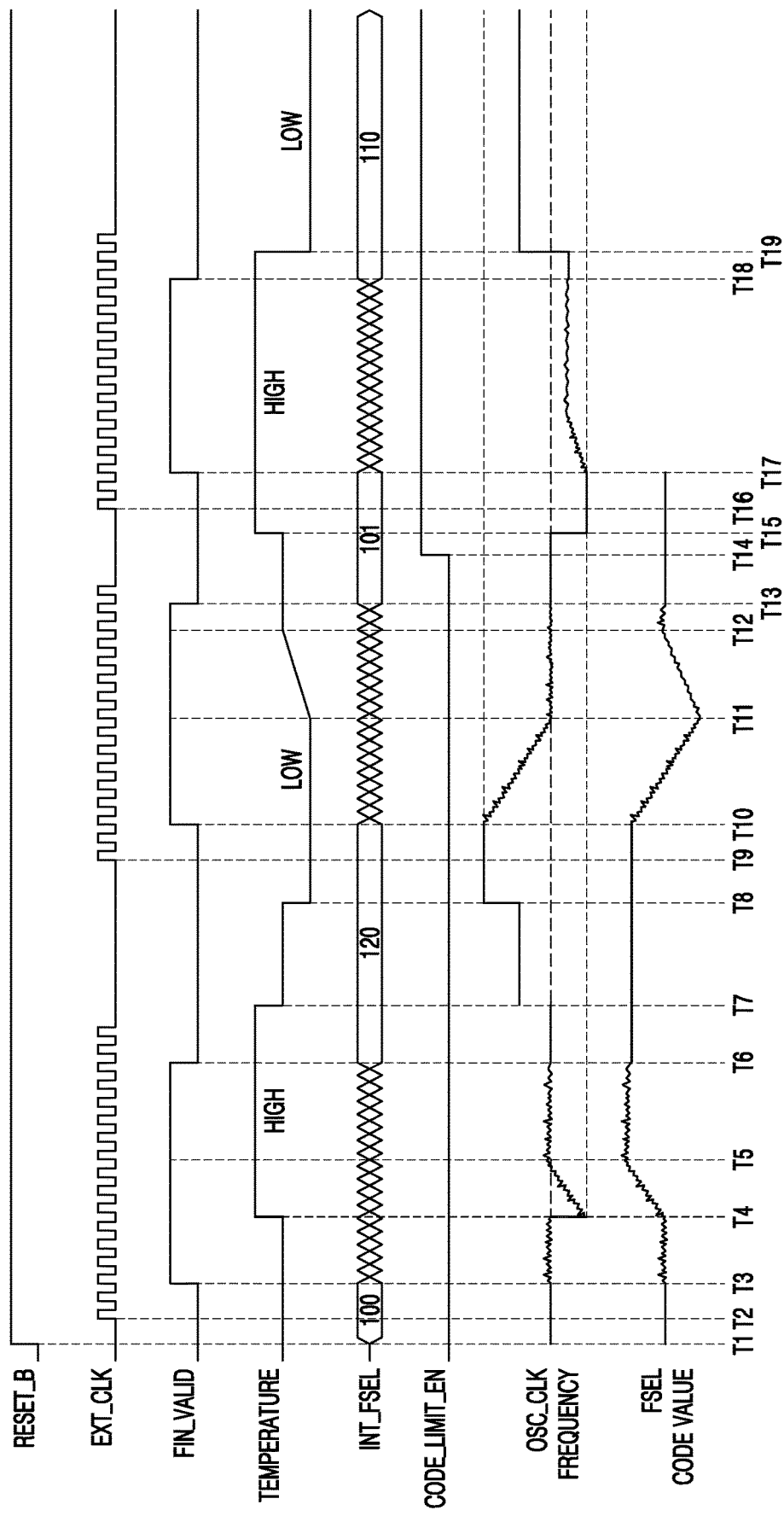
FIG. 3 is a timing diagram of an oscillation system according to an embodiment.

FIG. 3 is a timing diagram of an oscillation system according to an embodiment.

Referring to FIG. 3, an inverted reset signal RESET_B may transition to logic high at a time point T1. The FLL logic circuit 110 may receive the initial frequency selection signal INIT_FSEL in response to the transition of the inverted reset signal RESET_B and output the initial frequency selection signal INIT_FSEL to the relaxation oscillator 120. The relaxation oscillator 120 may output the oscillator clock signal OSC_CLK based on the initial frequency selection signal INIT_FSEL. The relaxation oscillator 120 may output the oscillator clock signal OSC_CLK having a target frequency based on the initial frequency selection signal INIT_FSEL. For example, the value of the initial frequency selection signal INIT_FSEL may be 100.

The external clock signal EXT_CLK may be input to the FLL logic circuit 110 at a time point T2. The external clock signal EXT_CLK may be input to the validity signal generator 210 of the FLL logic circuit 110. The validity signal generator 210 may determine the validity of the external clock signal EXT_CLK during a period between the time point T2 and a time point T3. For example, the validity signal generator 210 may monitor the magnitude of the external clock signal EXT_CLK during the period between the time point T2 and the time point T3 and determine whether there is a glitch in the external clock signal EXT_CLK.

The validity signal FIN_VALID may transition from logic low to logic high at the time point T3. In other words, the validity signal generator 210 may not detect the signal magnitude of a glitch in the external clock signal EXT_CLK input from the time point T2, and therefore may change the validity signal FIN_VALID, which indicates that the external clock signal EXT_CLK is valid, to logic high. When the validity signal FIN_VALID transitions to logic high, frequency calibration may be performed by the FLL logic circuit 110. In other words, during a period between the time point T3 and a time point T4, the FLL logic circuit 110 may change the internal frequency selection signal INT_FSEL such that the frequency of the oscillator clock signal OSC_CLK follows the target frequency. Because there is no change in temperature during the period between the time point T3 and the time point T4 and the internal frequency selection signal INT_FSEL may include a slight error in the frequency of the oscillator clock signal OSC_CLK, the value of the internal frequency selection signal INT_FSEL may be changed, for example, between 101 and 99.

At the time point T4, the frequency of the oscillator clock signal OSC_CLK may decrease. Referring to FIG. 3, the temperature of the oscillation system 100 may increase from room temperature to a high temperature at the time point T4. In an embodiment, the room temperature may be 25° C. and the high temperature may be 100° C. The relaxation oscillator 120 may include a resistive element, and the resistance of the resistive element may increase as temperature increases. As the resistance of the resistive element increases, a frequency that the relaxation oscillator 120 resonates with may decrease.

When the operating frequency of the oscillator clock signal OSC_CLK rapidly decreases at the time point T4, the FLL logic circuit 110 may adjust the value of the internal frequency selection signal INT_FSEL such that the operating frequency follows the target frequency. For example, from the time point T4, at which the operating frequency of the oscillator clock signal OSC_CLK rapidly decreases, up to a time point T5, at which the operating frequency of the oscillator clock signal OSC_CLK is the same as the target frequency, the FLL logic circuit 110 may increase the value of the internal frequency selection signal INT_FSEL so that the operating frequency is the same as the target frequency in each frequency window. For example, the value of the internal frequency selection signal INT_FSEL may be about 120 at the time point T5. Although the operating frequency of the oscillator clock signal OSC_CLK is the same as the target frequency at the time point T5, the frequency calibration may be continued up to a time point T6. In other words, the internal frequency selection signal INT_FSEL may be changed in real time in a range around a value of 120.

The validity signal FIN_VALID may transition to logic low at the time point T6. According to an embodiment, the validity signal generator 210 may be configured to generate the validity signal FIN_VALID during a certain time period. It may be not known when the input of the external clock signal EXT_CLK is interrupted because the external clock signal EXT_CLK may be a non-continuous or an intermittent clock source. Accordingly, the validity signal generator 210 may output the validity signal FIN_VALID only during a certain number of clocks. When the validity signal FIN_VALID transitions to logic low at the time point T6, the internal frequency selection signal INT_FSEL may be maintained at a fixed value. As described above, to enable the operating frequency of the oscillator clock signal OSC_CLK that has rapidly decreased at the time point T4, to follow the target frequency, the value of the internal frequency selection signal INT_FSEL may be maintained at around 120 from the time point T5 to the time point T6. At the time point T6 when the validity signal FIN_VALID transitions to logic low, the value of the internal frequency selection signal INT_FSEL may be 120.

The frequency of the oscillator clock signal OSC_CLK may increase at a time point T7. The temperature of the oscillation system 100 may decrease from the high temperature to room temperature at the time point T7. Because the operating frequency of the oscillator clock signal OSC_CLK is set to match the target frequency at the high temperature during the period between the time point T5 and the time point T6, the operating frequency of the oscillator clock signal OSC_CLK may increase even though the temperature changes from the high temperature to room temperature. Because the resistance of the resistive element of the relaxation oscillator 120 is proportional to the temperature, the resistance thereof may decrease as the temperature decreases. Because the resistance of the relaxation oscillator 120 is inversely proportional to the resonant frequency of the relaxation oscillator 120, the resonant frequency of the relaxation oscillator 120 may increase as the resistance of the relaxation oscillator 120 decreases.

The operating frequency of the oscillator clock signal OSC_CLK may increase at a time point T8. The temperature of the oscillation system 100 may decrease from room temperature to a low temperature at the time point T8. The description given above about the time point T7 may be applied to the increase of the operating frequency of the oscillator clock signal OSC_CLK at the time point T8, and thus, redundant descriptions thereof are omitted. In a period between the time point T6 to the time point T8 during which the validity signal FIN_VALID is maintained logic low, even if the operating frequency of the oscillator clock signal OSC_CLK is different from the target frequency, the value of the internal frequency selection signal INT_FSEL for following the target frequency may be fixed.

The external clock signal EXT_CLK may be input to the FLL logic circuit 110 at a time point T9. The validity signal generator 210 of the FLL logic circuit 110 may determine the validity of the external clock signal EXT_CLK during a period between the time point T9 and a time point T10. The period during which the validity of the external clock signal EXT_CLK is determined may be the same as the period between the time point T2 and the time point T3.

The validity signal FIN_VALID may transition from logic low to logic high at the time point T10. When the external clock signal EXT_CLK received during the period between the time point T9 and the time point T10 does not have a glitch, the validity signal generator 210 may change the validity signal FIN_VALID to logic high. The FLL logic circuit 110 may start frequency calibration based on the logic high of the validity signal FIN_VALID. Referring again to FIG. 2, based on the validity signal FIN_VALID transitioning to logic high, the clock divider 220 generates the reference frequency signal FREF, the operating frequency of the oscillator clock signal OSC_CLK is compared with the frequency of the reference frequency signal FREF, and the value of the internal frequency selection signal INT_FSEL is adjusted so that the operating frequency of the oscillator clock signal OSC_CLK follows the target frequency.

At the time point T10 when the validity signal FIN_VALID transitions to logic high, the value of the internal frequency selection signal INT_FSEL may be 120. At the time point T10, the operating frequency of the oscillator clock signal OSC_CLK may be higher than the target frequency. This is because the temperature previously decreased twice at the time points T7 and T8 while the frequency calibration was not performed. The value of the internal frequency selection signal INT_FSEL may be decreased from the time point T10 so that the operating frequency of the oscillator clock signal OSC_CLK is the same as the target frequency. For example, the value of the internal frequency selection signal INT_FSEL may decrease to 80 at a time point T11.

The temperature may slowly increase from the time point T11. While the temperature rapidly increases or decreases at the time point T4, T7, or T8, the temperature may slowly and linearly increase from the time point T11 to a time point T12. During a period between the time point T11 and the time point T12, the value of the internal frequency selection signal INT_FSEL may also linearly increase in correspondence to the linearly increasing temperature. The operating frequency of the oscillator clock signal OSC_CLK reaches the target frequency at the time point T11 and the temperature does not rapidly increase but linearly increases from the time point T11 to the time point T12, and accordingly, the operating frequency of the oscillator clock signal OSC_CLK may be the same as the target frequency or be in a margin of error from the target frequency. Because the internal frequency selection signal INT_FSEL increases when the temperature slowly increases from the time point T11 to the time point T12, the frequency calibration may be considered as being performed in real time.

The validity signal FIN_VALID may transition from logic high to logic low at a time point T13. The value of the internal frequency selection signal INT_FSEL may be maintained constant from the time point T13. For example, the value of the internal frequency selection signal INT_FSEL may be 101.

The code limit enable signal CODE_LIMIT_EN may be activated at a time point T14. The code limit enable signal CODE_LIMIT_EN may limit the range of the value of the internal frequency selection signal INT_FSEL based on the initial frequency selection signal INIT_FSEL. For example, when the code limit enable signal CODE_LIMIT_EN transitions to logic high, the internal frequency selection signal INT_FSEL may be limited to a variance of % based the value of the initial frequency selection signal INIT_FSEL, which may be for example 100. Accordingly, when the code limit enable signal CODE_LIMIT_EN is activated, the value of the internal frequency selection signal INT_FSEL is prevented from excessively changing to enable the operating frequency of the oscillator clock signal OSC_CLK to follow the target frequency even if the temperature abnormally increases or decreases, and the swing width of the internal frequency selection signal INT_FSEL is fixed. When the code limit enable signal CODE_LIMIT_EN is activated and the temperature changes greatly, the operating frequency of the oscillator clock signal OSC_CLK may not follow the target frequency, but a code limit value may be predetermined such that an error between the operating frequency and the target frequency is within an error range of the oscillation system 100. In other words, referring to FIG. 3, when the internal frequency selection signal INT_FSEL has a variance of 10% based on 100 that is the value of the initial frequency selection signal INIT_FSEL, the range of the value of the internal frequency selection signal INT_FSEL may be 90 to 110.

As the temperature rapidly increases at a time point T15, the operating frequency of the oscillator clock signal OSC_CLK may rapidly decrease. The external clock signal EXT_CLK may be newly input at a time point T16, and the validity signal FIN_VALID may transition to logic high at a time point T17. Frequency calibration may be performed by the FLL logic circuit 110 from the time point T17. When the frequency calibration is started at the time point T17, the internal frequency selection signal INT_FSEL starts from a value of 101. Because the operating frequency of the oscillator clock signal OSC_CLK is lower than the target frequency at the time point T17, the internal frequency selection signal INT_FSEL may start increasing to increase the operating frequency of the oscillator clock signal OSC_CLK. However, because the code limit enable signal CODE_LIMIT_EN has been activated, a maximum value permissible for the internal frequency selection signal INT_FSEL is 110. When the code limit enable signal CODE_LIMIT_EN is not activated, the value of the internal frequency selection signal INT_FSEL may increase up to 120 so that the operating frequency of the oscillator clock signal OSC_CLK follows the target frequency. However, the maximum value of the internal frequency selection signal INT_FSEL is 110, and accordingly, the operating frequency of the oscillator clock signal OSC_CLK approaches a value that is lower than the target frequency.

The validity signal FIN_VALID may transition to logic low at a time point T18, and the internal frequency selection signal INT_FSEL may be maintained at a constant value. The constant value of the internal frequency selection signal INT_FSEL, which is maintained from the time point T18 due to the influence of the code limit enable signal CODE_LIMIT_EN, may be 110. Although the operating frequency is lower than the target frequency at a high temperature at the time point T18, the oscillator clock signal OSC_CLK operates at a frequency higher than the target frequency when the temperature rapidly decreases to the low temperature at a time point T19. An error in the operating frequency at the low temperature at the time point T19 after the code limit enable signal CODE_LIMIT_EN is activated is reduced in comparison to an error in the operating frequency at the low temperature at the time point T8. Similarly, an error in the operating frequency at the high temperature at the time point T18 after the code limit enable signal CODE_LIMIT_EN is activated is reduced in comparison to an error in the operating frequency at the high temperature at the time point T4 when the code limit enable signal CODE_LIMIT_EN is not activated.

Figure 4:
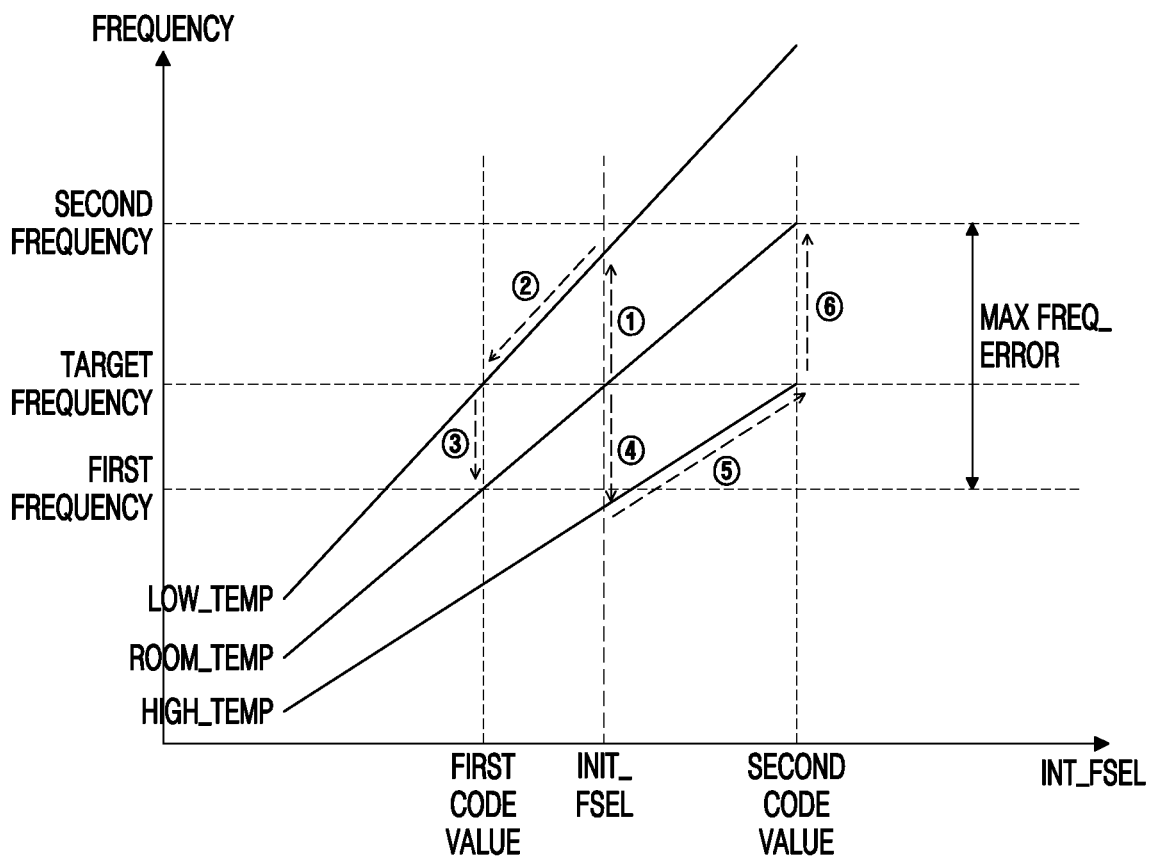
FIG. 4 is a graph of an internal frequency selection signal versus a frequency when a code limit enable signal is inactivated, according to an embodiment.

FIG. 4 is a graph of the internal frequency selection signal INT_FSEL versus a frequency when the code limit enable signal CODE_LIMIT_EN is not activated, according to an embodiment.

Referring to FIG. 4, the internal frequency selection signal INT_FSEL may be set to the value of the initial frequency selection signal INIT_FSEL. The initial frequency selection signal INIT_FSEL may correspond to a trim value for outputting a target frequency taking into account element characteristics that may different according to chip processes. The relaxation oscillator 120 may receive the internal frequency selection signal INT_FSEL and output the oscillator clock signal OSC_CLK that operates at the target frequency.

According to an embodiment, when the temperature rapidly decreases, the operating frequency of the oscillator clock signal OSC_CLK may increase along path ①. In other words, the path ① may correspond to the case where the validity signal FIN_VALID is logic low though the temperature has rapidly decreased. Because the validity signal FIN_VALID is logic low, the internal frequency selection signal INT_FSEL may be maintained constant. In other words, the operating frequency of the oscillator clock signal OSC_CLK may increase along the Y axis to a frequency that crosses a low-temperature graph LOW_TEMP of the same internal frequency selection signal INT_FSEL value.

According to an embodiment, when the external clock signal EXT_CLK is received after the operating frequency of the oscillator clock signal OSC_CLK increases along the path ①, frequency calibration may be performed based on path ②. In other words, when the external clock signal EXT_CLK is received and determined to be valid because there is no glitch in the external clock signal EXT_CLK, the validity signal FIN_VALID may transition to logic high, and the frequency calibration may be started. In the case of FIG. 4, because there is no code limit to the internal frequency selection signal INT_FSEL, the frequency calibration may be performed while changing the value of the internal frequency selection signal INT_FSEL so that the operating frequency of the oscillator clock signal OSC_CLK is the same as the target frequency along the low-temperature graph LOW_TEMP. Referring to FIG. 4, the internal frequency selection signal INT_FSEL may be decreased to a first code value.

According to an embodiment, the temperature may change from the low temperature to room temperature. The operating frequency of the oscillator clock signal OSC_CLK may decrease along path ③. In other words, the path ③ may correspond to the case where the validity signal FIN_VALID is logic low though the temperature has rapidly increased. Because the validity signal FIN_VALID is logic low, the internal frequency selection signal INT_FSEL may be maintained at the first code value. The operating frequency of the oscillator clock signal OSC_CLK may decrease along the Y axis of the first code value to a frequency that crosses a room-temperature graph ROOM_TEMP. The decreased frequency may correspond to a first frequency FIRST_FREQ.

According to an embodiment, when the temperature rapidly increases, the operating frequency of the oscillator clock signal OSC_CLK may decrease along path ④. In other words, the path ④ may correspond to the case where the validity signal FIN_VALID is logic low though the temperature has rapidly increased. Because the validity signal FIN_VALID is logic low, the internal frequency selection signal INT_FSEL may be maintained constant. The operating frequency of the oscillator clock signal OSC_CLK may decrease along the Y axis to a frequency that crosses a high-temperature graph HIGH_TEMP so that the internal frequency selection signal INT_FSEL is maintained at the same X value.

According to an embodiment, when the external clock signal EXT_CLK is received after the operating frequency of the oscillator clock signal OSC_CLK decreases along the path ④, frequency calibration may be performed based on path ⑤. In other words, when the external clock signal EXT_CLK is received and determined to be valid because there is no glitch in the external clock signal EXT_CLK, the validity signal FIN_VALID may transition to logic high, and the frequency calibration may be started. In the case of FIG. 4, because there is no code limit to the internal frequency selection signal INT_FSEL, the frequency calibration may be performed while changing the value of the internal frequency selection signal INT_FSEL so that the operating frequency of the oscillator clock signal OSC_CLK is the same as the target frequency along the high-temperature graph HIGH_TEMP. Referring to FIG. 4, the internal frequency selection signal INT_FSEL may be increased to a second code value.

According to an embodiment, the temperature may change from the high temperature to room temperature. The operating frequency of the oscillator clock signal OSC_CLK may increase along path ⑥. In other words, the path ⑥ may correspond to the case where the validity signal FIN_VALID is logic low though the temperature has rapidly decreased. Because the validity signal FIN_VALID is logic low, the internal frequency selection signal INT_FSEL may be maintained at the second code value. The operating frequency of the oscillator clock signal OSC_CLK may increase along the Y axis of the second code value to a frequency that crosses the room-temperature graph ROOM_TEMP. The increased frequency may correspond to a second frequency SECOND_FREQ. In other words, a maximum error range MAX FREQ ERROR of the operating frequency of the oscillator clock signal OSC_CLK according to the paths ① to ⑥ may be the difference between the second frequency SECOND_FREQ and the first frequency FIRST_FREQ.

Figure 5:
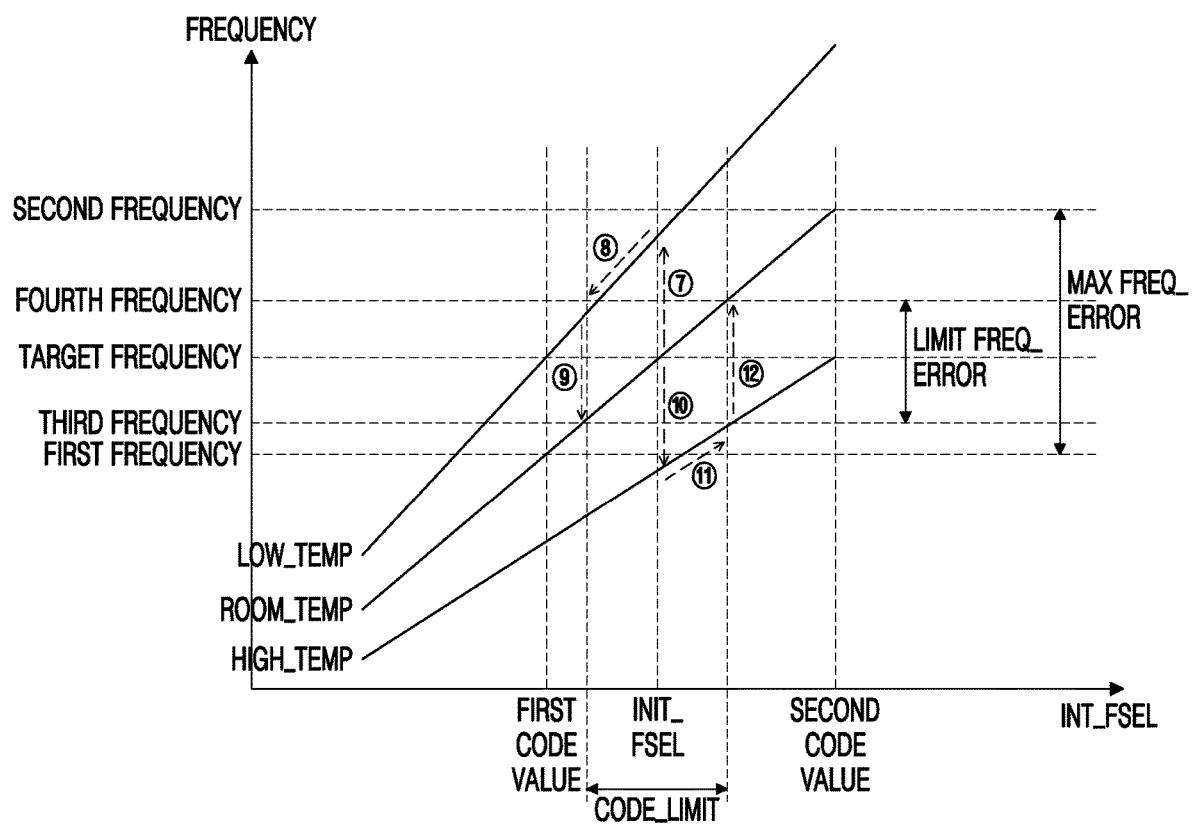
FIG. 5 is a graph of an internal frequency selection signal versus a frequency when a code limit enable signal is activated, according to an embodiment.

FIG. 5 is a graph of the internal frequency selection signal INT_FSEL versus a frequency when the code limit enable signal CODE_LIMIT_EN is activated, according to an embodiment.

Referring to FIG. 5, when the temperature rapidly decreases, the operating frequency of the oscillator clock signal OSC_CLK may increase along path ⑦. In other words, the path ⑦ may correspond to the case where the validity signal FIN_VALID is logic low though the temperature has rapidly decreased. Because the validity signal FIN_VALID is logic low, the internal frequency selection signal INT_FSEL may be maintained constant. In other words, the operating frequency of the oscillator clock signal OSC_CLK may increase along the Y axis to a frequency that crosses the low-temperature graph LOW_TEMP of the same internal frequency selection signal INT_FSEL value.

According to an embodiment, when the external clock signal EXT_CLK is received after the operating frequency of the oscillator clock signal OSC_CLK increases along the path ⑦, frequency calibration may be performed based on path ⑧. In other words, when the external clock signal EXT_CLK is received and determined to be valid because there is no glitch in the external clock signal EXT_CLK, the validity signal FIN_VALID may transition to logic high, and the frequency calibration may be started.

When the code limit enable signal CODE_LIMIT_EN is activated, the value of the internal frequency selection signal INT_FSEL may be limited. The value of the internal frequency selection signal INT_FSEL may be decreased so that the operating frequency of the oscillator clock signal OSC_CLK follows the target frequency on the low-temperature graph LOW_TEMP. At this time, the value of the internal frequency selection signal INT_FSEL may be decreased to a lower bound based on the value of the initial frequency selection signal INIT_FSEL. In other words, even though the frequency calibration is performed, the operating frequency of the oscillator clock signal OSC_CLK may not decrease to the target frequency.

According to an embodiment, the temperature may change from the low temperature to room temperature. The operating frequency of the oscillator clock signal OSC_CLK may decrease along path ⑨. In other words, the path ⑨ may correspond to the case where the validity signal FIN_VALID is logic low though the temperature has rapidly increased. Because the validity signal FIN_VALID is logic low, the internal frequency selection signal INT_FSEL may be be maintained at the lower bound of a code limit CODE LIMIT. The operating frequency of the oscillator clock signal OSC_CLK may decrease along the Y axis of the lower bound of the code limit CODE LIMIT to a frequency that crosses the room-temperature graph ROOM_TEMP. The decreased frequency may correspond to a third frequency THIRD_FREQ.

According to an embodiment, when the temperature rapidly increases, the operating frequency of the oscillator clock signal OSC_CLK may decrease along path ⑩. In other words, the path ⑩ may correspond to the case where the validity signal FIN_VALID is logic low though the temperature has rapidly increased. Because the validity signal FIN_VALID is logic low, the internal frequency selection signal INT_FSEL may be be maintained constant. The operating frequency of the oscillator clock signal OSC_CLK may decrease along the Y axis to a frequency that crosses the high-temperature graph HIGH_TEMP so that the internal frequency selection signal INT_FSEL is maintained at the same X value.

According to an embodiment, when the external clock signal EXT_CLK is received after the operating frequency of the oscillator clock signal OSC_CLK decreases along the path ⑩, frequency calibration may be performed based on path ⑪. In other words, when the external clock signal EXT_CLK is received and determined to be valid because there is no glitch in the external clock signal EXT_CLK, the validity signal FIN_VALID may transition to logic high, and the frequency calibration may be started.

When the code limit enable signal CODE_LIMIT_EN is activated, the value of the internal frequency selection signal INT_FSEL may be limited. The value of the internal frequency selection signal INT_FSEL may be increased so that the operating frequency of the oscillator clock signal OSC_CLK follows the target frequency on the high-temperature graph HIGH_TEMP. At this time, the value of the internal frequency selection signal INT_FSEL may be increased to an upper bound based on the value of the initial frequency selection signal INIT_FSEL. In other words, even though the frequency calibration is performed, the operating frequency of the oscillator clock signal OSC_CLK may not increase to the target frequency.

According to an embodiment, the temperature may change from the high temperature to room temperature. The operating frequency of the oscillator clock signal OSC_CLK may increase along path ⑫. In other words, the path ⑫ may correspond to the case where the validity signal FIN_VALID is logic low though the temperature has rapidly decreased. Because the validity signal FIN_VALID is logic low, the internal frequency selection signal INT_FSEL may be be maintained at the upper bound of the code limit CODE LIMIT. The operating frequency of the oscillator clock signal OSC_CLK may increase along the Y axis of the upper bound of the code limit CODE LIMIT to a frequency that crosses the room-temperature graph ROOM_TEMP. The increased frequency may correspond to a fourth frequency FOURTH FREQ. In other words, when the code limit enable signal CODE_LIMIT_EN is activated, a limit error range LIMIT FREQ ERROR of the operating frequency of the oscillator clock signal OSC_CLK according to the paths ⑦ to ⑫ may be the difference between the third frequency THIRD_FREQ and the fourth frequency FOURTH FREQ. Referring to FIGS. 4 and 5, it may be seen that the magnitude of a frequency error is reduced when the code limit enable signal CODE_LIMIT_EN is activated and limits the value of the internal frequency selection signal INT_FSEL.

FIG. 6 is a mapping table between temperature and the internal frequency selection signal INT_FSEL, according to an embodiment.

Referring to FIG. 6, an electronic device including the oscillation system 100 may store the mapping table between the temperature and the internal frequency selection signal INT_FSEL.

The mapping table may store a code value of the internal frequency selection signal INT_FSEL according to a temperature change while the code limit enable signal CODE_LIMIT_EN is not activated. For example, the mapping table may store 100 as the value of the initial frequency selection signal INIT_FSEL. Thereafter, when the temperature increases to 50☐C, the value of the internal frequency selection signal INT_FSEL may be changed so that the operating frequency of the oscillator clock signal OSC_CLK follows the target frequency. The electronic device may store, in the mapping table, a value of the internal frequency selection signal INT_FSEL at the time when the operating frequency of the oscillator clock signal OSC_CLK is the same as the target frequency. The stored value of the internal frequency selection signal INT_FSEL may be 105. Similarly, when the temperature increases to 75☐C, the value of the internal frequency selection signal INT_FSEL at the time when the frequency calibration is completed may be 110. When the temperature increases to 100☐C, the value of the internal frequency selection signal INT_FSEL at the time when the frequency calibration is completed may be 120.

When the temperature changes and the number of times of completing the frequency calibration increases with the changes of the temperature, the electronic device may store a representative value of the accumulated values of the internal frequency selection signal INT_FSEL in the mapping table. The representative value may correspond to a maximum value, a minimum value, or an average of the accumulated values of the internal frequency selection signal INT_FSEL, but embodiments are not limited thereto.

According to embodiments, when the external clock signal EXT_CLK is not received, the oscillation system 100 may receive current temperature information from a temperature sensor and input the value of the internal frequency selection signal INT_FSEL, which is mapped to the current temperature information, to the relaxation oscillator 120. Accordingly, the oscillation system 100 may actively perform frequency calibration even though the external clock signal EXT_CLK is not received.

Figure 7:
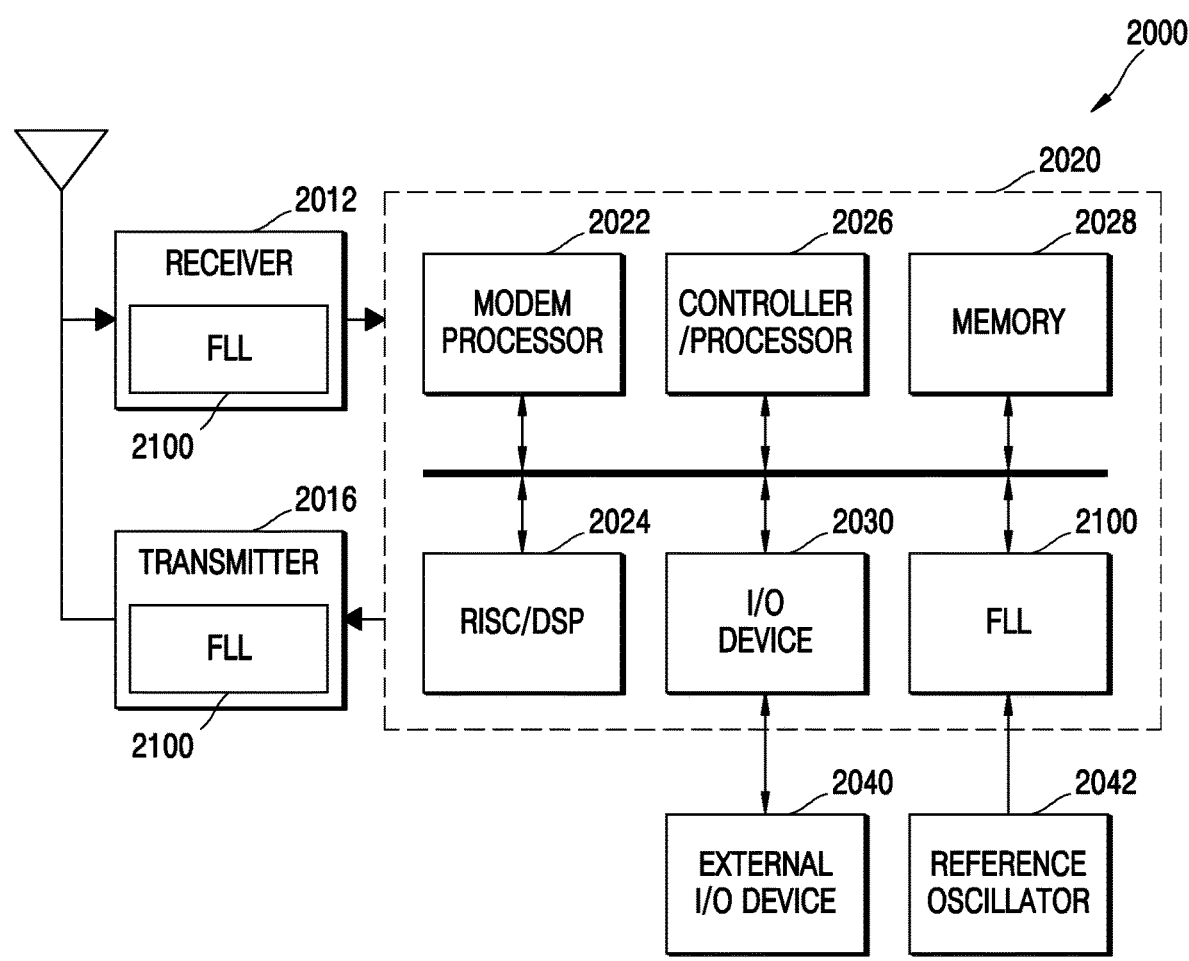
FIG. 7 is a block diagram of an electronic device according to an embodiment.

FIG. 7 is a block diagram of an electronic device 2000 according to an embodiment.

Referring to FIG. 7, the electronic device 2000 may include a receiver 2012, a transmitter 2016, a communication module 2020, an antenna, an external input/output (I/O) device 2040, and the oscillation system 2042 The receiver 2012 may include an FLL 2100 according to embodiments. The FLL 2100 may include the relaxation oscillator 120 and the FLL logic circuit 110, according to embodiments. The transmitter 2016 may include an FLL 2100 according to embodiments. The receiver 2012 may externally receive an analog signal through the antenna, convert the analog signal into a digital signal using the output signal of the FLL 2100 thereof, and provide the digital signal to the communication module 2020. The transmitter 2016 may receive a digital signal from the communication module 2020, convert the digital signal into an analog signal using the output signal of the FLL 2100 thereof, and output the analog signal through the antenna. The oscillation system 2042 may include a crystal oscillator (XO), a voltage controlled crystal oscillator (VCXO), or a temperature compensated crystal oscillator (TCXO).

The communication module 2020 may include a modem processor 2022, a reduced instruction set computer (RISC)/digital signal processor (DSP) 2024, a controller/processor 2026, a memory 2028, an I/O device 2030, and an FLL 2100.

The modem processor 2022 may perform processing operations, such as encoding, modulation, demodulation, and decoding, to transmit and receive data. The RISC/DSP 2024 may perform a general or specialized processing operation in the electronic device 2000.

The controller/processor 2026 may control blocks of the communication module 2020. The memory 2028 may store data, various instructions code, and the mapping table of FIG. 6. The I/O device 2030 may communicate with the external I/O device 2040. The communication module 2020 (e.g., the modem processor 2022 or the controller/processor 2026) may perform a processing operation, which is necessary for communication, using an output signal generated by the FLL 2100.

According to embodiments, an oscillation system may include a relaxation oscillator configured to provide an oscillation clock signal and an FLL logic circuit. The FLL logic circuit may receive an external clock signal. During a first time period in which the external clock signal is determined to be valid, the FLL logic circuit may perform: based on determining that an oscillation frequency of the oscillation clock signal does not match a target frequency, adjusting a frequency selection signal based on the external clock signal and a difference between the oscillation frequency and the target frequency; and providing the frequency selection signal to the relaxation oscillator, wherein the frequency selection signal causes the relaxation oscillator to adjust the oscillation frequency to match the target frequency. During a second time period in which the external clock signal is determined to be not valid, the FLL logic circuit may maintain the frequency selection signal at a constant value.

According to embodiments, during the first time period, the FLL logic circuit may further adjust the frequency selection signal within a predetermined range. According to embodiments, the FLL logic circuit may determine a temperature of the oscillation system during the second time period, and select the constant value from among a plurality of predetermined constant values based on the temperature.

While the embodiments have been particularly shown and described, it will be understood that various changes in form and details may be made therein without departing from the spirit and scope of the following claims.

What is claimed is:

1. A frequency-locked loop (FLL) logic circuit comprising:
   a validity signal generator configured to receive an external clock signal and determine whether a glitch occurs in the external clock signal;
   a clock divider configured to generate a reference frequency clock signal based on the external clock signal and a determination result of the validity signal generator;
   a synchronizer configured to synchronize a phase of an oscillator clock signal with a phase of the reference frequency clock signal;

a clock counter coupled to the synchronizer and configured to count a number of pulses of the oscillator clock signal during a reference time; and
a code limiter configured to determine a range of a frequency selection value for calibrating an operating frequency of the oscillator clock signal based on the counted number of pulses.

2. The FLL logic circuit of claim 1, wherein the range is a predetermined range that is determined based on an initial frequency selection value.

3. The FLL logic circuit of claim 1, wherein the validity signal generator is further configured to:
monitor the external clock signal for a predetermined time; and
generate and transmit a validity signal to the clock divider based on determining that the glitch does not occur in the external clock signal,
wherein the validity signal indicates that the external clock signal is valid.

4. The FLL logic circuit of claim 3, wherein the clock divider is further configured to generate and transmit a clock signal having a target frequency to the synchronizer based on the validity signal received from the validity signal generator.

5. The FLL logic circuit of claim 4, wherein the clock counter is further configured to:
determine whether the operating frequency is identical to the target frequency based on the number of pulses; and
based on the operating frequency being different from the target frequency, output a frequency change value which allows the operating frequency to be identical to the target frequency.

6. The FLL logic circuit of claim 1, wherein the validity signal generator is further configured to generate and transmit a validity signal to the clock divider based on determining that the glitch occurs in the external clock signal, and
wherein the validity signal indicates that the external clock signal is invalid.

7. The FLL logic circuit of claim 6, wherein the clock divider is further configured to determine that the external clock signal is invalid, and bypass generation of the reference frequency clock signal.

8. The FLL logic circuit of claim 1, wherein the code limiter is further configured to:
store in advance an upper bound of the frequency selection value and a lower bound of the frequency selection value; and
limit a range of a frequency change value to the upper bound and the lower bound based on a control signal indicating an activation of a code limit,
wherein the frequency change value allows the operating frequency to be identical to a target frequency.

9. The FLL logic circuit of claim 1, wherein the external clock signal corresponds to an input clock signal that is not continuously input.

10. An oscillation system comprising:
a relaxation oscillator; and
a frequency-locked loop (FLL) logic circuit coupled to the relaxation oscillator, wherein the FLL logic circuit includes:
a validity signal generator configured to receive an external clock signal and determine whether there is a glitch in the external clock signal,
a clock divider configured to generate a reference frequency clock signal based on the external clock signal and a determination result of the validity signal generator,
a synchronizer configured to synchronize a phase of an oscillator clock signal with a phase of the reference frequency clock signal,
a clock counter coupled to the synchronizer and configured to count a number of pulses of the oscillator clock signal for a reference time, and
a code limiter configured to determine a range of a frequency selection value for calibrating an operating frequency of the oscillator clock signal based on the counted number of pulses.

11. The oscillation system of claim 10, wherein the range is a predetermined range that is determined based on an initial frequency selection value.

12. The oscillation system of claim 10, wherein the validity signal generator is further configured to:
monitor the external clock signal for a predefined time; and
generate and transmit a validity signal to the clock divider based on determining that the glitch does not occur in the external clock signal,
wherein the validity signal indicates that the external clock signal is valid.

13. The oscillation system of claim 12, wherein the clock divider is further configured to generate and transmit a clock signal having a target frequency to the synchronizer based on the validity signal received from the validity signal generator.

14. The oscillation system of claim 13, wherein the clock counter is further configured to:
determine whether the operating frequency is identical to the target frequency based on the number of pulses; and
based on the operating frequency being different from the target frequency, output a frequency change value which allows the operating frequency to be identical to the target frequency.

15. The oscillation system of claim 10, wherein the validity signal generator is further configured to generate and transmit a validity signal to the clock divider based on determining that the glitch occurs in the external clock signal, and
wherein the validity signal indicates that the external clock signal is invalid.

16. The oscillation system of claim 15, wherein the clock divider is further configured to determine that the external clock signal is invalid and bypass generation of the reference frequency clock signal.

17. The oscillation system of claim 10, wherein the code limiter is further configured to:
store in advance an upper bound of the frequency selection value and a lower bound of the frequency selection value; and
limit a range of a frequency change value to the upper bound and the lower bound based on a control signal indicating an activation of a code limit,
wherein the frequency change value allows the operating frequency to be identical to a target frequency.

18. The oscillation system of claim 10, wherein the external clock signal corresponds to an input clock signal that is not continuously input.

19. An operating method of a frequency-locked loop (FLL) logic circuit, the operating method comprising:
receiving an external clock signal;
determining whether a glitch occurs in the external clock signal;
generating a reference frequency clock signal based on determining that the glitch does not occur in the external clock signal;

synchronizing a phase of the reference frequency clock signal with a phase of an oscillator clock signal;
performing clock counting;
determining whether an operating frequency of the oscillator clock signal is identical to a target frequency based on a result of the clock counting; and
adjusting a frequency selection value based on the result of the clock counting,
wherein the frequency selection value is used to calibrate the operating frequency of the oscillator clock signal.

20. The operating method of claim 19, further comprising receiving a control signal indicating activation of a code limit,
wherein the control signal corresponds to a signal instructing to limit a range of a frequency change value which allows the operating frequency to be identical to the target frequency.

* * * * *